(12) United States Patent
Huang et al.

(10) Patent No.: US 9,761,684 B2
(45) Date of Patent: Sep. 12, 2017

(54) METHOD AND STRUCTURE FOR METAL GATES

(71) Applicant: Taiwan Semiconductor Manufacturing Company, Ltd., Hsin-Chu (TW)

(72) Inventors: Ju-Li Huang, Nantou County (TW); Chao-Cheng Chen, Hsin-Chu (TW); Calvin Chiang, Hsinchu County (TW); Ming-Chia Tai, Hsinchu County (TW); Ming-Hsi Yeh, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/251,690

(22) Filed: Aug. 30, 2016

(65) Prior Publication Data
US 2016/0372565 A1    Dec. 22, 2016

Related U.S. Application Data

(62) Division of application No. 14/579,864, filed on Dec. 22, 2014, now Pat. No. 9,431,304.

(51) Int. Cl.
| | |
|---|---|
| H01L 21/70 | (2006.01) |
| H01L 29/49 | (2006.01) |
| H01L 21/8238 | (2006.01) |
| H01L 27/092 | (2006.01) |
| H01L 29/51 | (2006.01) |
| H01L 21/28 | (2006.01) |
| H01L 29/66 | (2006.01) |
| H01L 27/088 | (2006.01) |

(52) U.S. Cl.
CPC .... *H01L 29/4966* (2013.01); *H01L 21/28088* (2013.01); *H01L 21/823821* (2013.01); *H01L 21/823828* (2013.01); *H01L 21/823842* (2013.01); *H01L 21/823857* (2013.01); *H01L 27/0886* (2013.01); *H01L 27/092* (2013.01); *H01L 29/517* (2013.01); *H01L 29/66545* (2013.01)

(58) Field of Classification Search
CPC .................. H01L 29/66545; H01L 29/4966
USPC .......................................... 257/369
See application file for complete search history.

(56) References Cited

U.S. PATENT DOCUMENTS

| | | |
|---|---|---|
| 7,732,346 B2 | 6/2010 | Hsu et al. |
| 8,048,733 B2 | 11/2011 | Yeh et al. |
| 8,361,855 B2 | 1/2013 | Yeh et al. |
| 8,415,254 B2 | 4/2013 | Yeh et al. |
| 8,487,378 B2 | 7/2013 | Goto et al. |
| 8,586,436 B2 | 11/2013 | Ng et al. |

(Continued)

OTHER PUBLICATIONS

Dorothee Brovelli at al., "Highly Oriented, Self-Assembled Alkanephosphate Monolayers on Tantalum (V) Oxide Surfaces," Langmuir, vol. 15, No. 13, 1999, pp. 4324 through 4327.

(Continued)

*Primary Examiner* — Anthony Ho
(74) *Attorney, Agent, or Firm* — Haynes and Boone, LLP

(57) ABSTRACT

A semiconductor device having metal gates and methods of forming the same are disclosed. The semiconductor device includes a substrate and a gate structure over the substrate. The gate structure includes a gate dielectric layer over the substrate, a barrier layer over the gate dielectric layer, an oxide layer over the barrier layer, and a work function metal layer over the oxide layer.

20 Claims, 14 Drawing Sheets

(56) References Cited

U.S. PATENT DOCUMENTS

| | | |
|---|---|---|
| 8,729,634 B2 | 5/2014 | Shen et al. |
| 8,826,213 B1 | 9/2014 | Ho et al. |
| 8,887,106 B2 | 11/2014 | Ho et al. |
| 8,943,455 B2 | 1/2015 | Chen et al. |
| 9,337,192 B2 | 5/2016 | JangJian et al. |
| 2013/0075831 A1 | 3/2013 | JangJian et al. |
| 2015/0364573 A1 | 12/2015 | Yeh et al. |

OTHER PUBLICATIONS

Flavio A. Pavan et al., "Adsorption of Phosphoric Acid on Niobium Oxide Coated Cellulose Fiber: Preparation, Characterization and Ion Exchange Property," J. Braz. Chem. Soc., vol. 16, No. 4, 2005, pp. 815 through 820.

Marcus Textor et al., "Structured Chemistry of Self Assembled Monolayers of Octadecylphosphoric Acid on Tantalum Oxide Surfaces," Langmuir, vol. 16, No. 7, 2000, pp. 3257 through 3271.

S. Tosatti et al., "Self-Assembled Monolayers of Dodecyl and Hydrozy-dodecyl Phosphates on Both Smooth and Rough Titanium and Titanium Oxide Surfaces," Langmuir, vol. 18, No. 9, 2002, pp. 3537 through 3548.

METHOD AND STRUCTURE FOR METAL GATES

PRIORITY

This is a divisional of U.S. patent application Ser. No. 14/579,864, entitled "Method and Structure for Metal Gates," filed Dec. 22, 2014, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, when fabricating field effect transistors (FETs), such as fin-like FETs (FinFETs), device performance can be improved by using a metal gate electrode instead of a typically polysilicon gate electrode. One process of forming a metal gate stack is termed a replacement-gate or "gate-last" process in which the final gate stack is fabricated "last" which allows for reduced number of subsequent processes, including high temperature processing, that is performed after formation of the gate. However, there are challenges to implementing such IC fabrication processes, especially with scaled down IC features and complex surface topology in advanced process nodes, such as N16, N10, and beyond. One challenge is that metal patterning processes may damage metal barrier layers provided between the metal gate electrode and a gate dielectric layer. Consequently, metal materials may intrude into the gate dielectric layer, causing device defects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
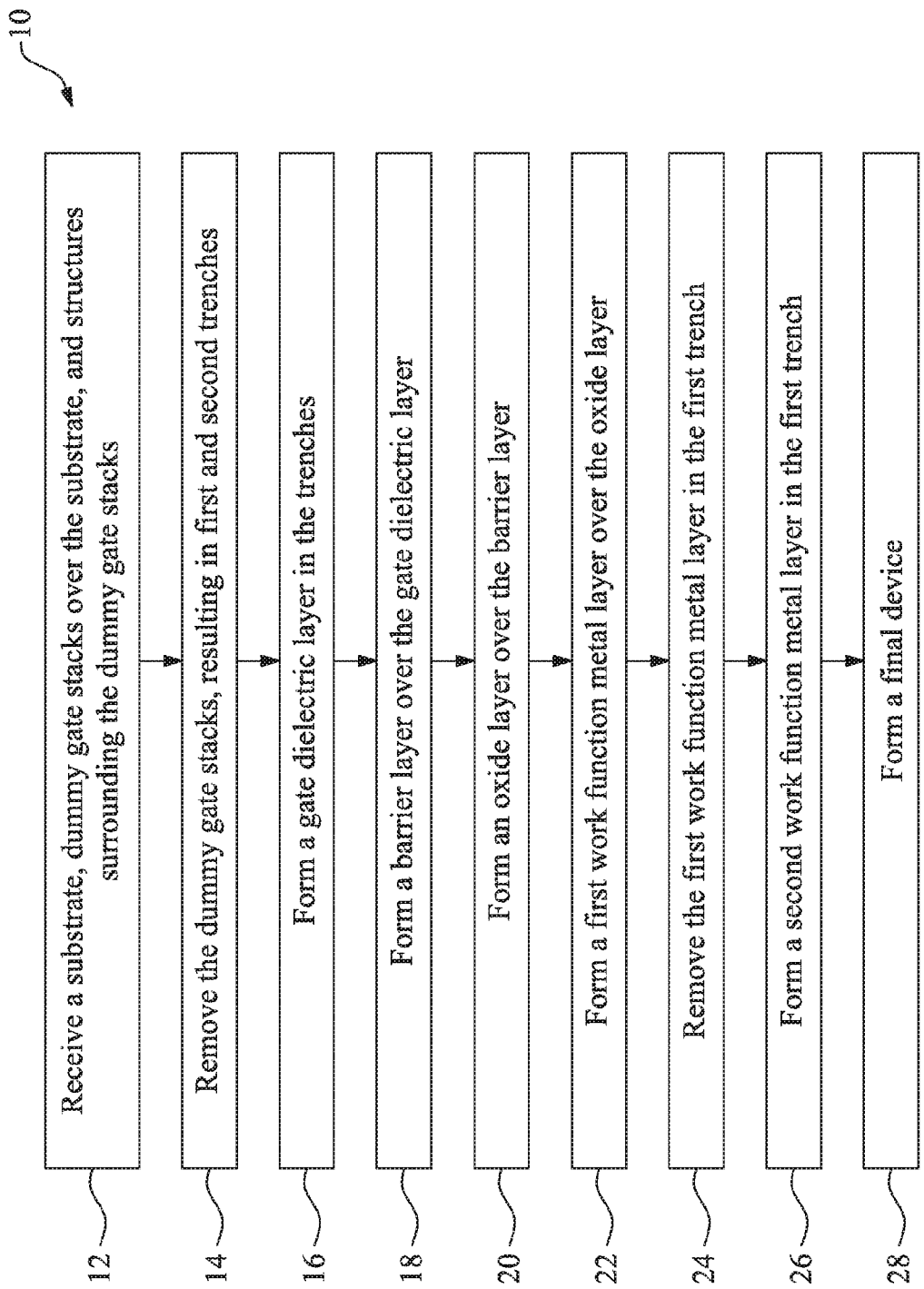
FIG. 1 shows a flow chart of a method of fabricating a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to semiconductor devices having FinFETs. It is an objective of the present disclosure to provide methods for and structures of protective layer(s) that effectively protect a gate dielectric layer thereunder in FinFET "gate-last" processes.

In a gate-last process for forming a metal gate for a transistor, a dummy gate stack is formed over a substrate as a placeholder for an actual gate stack. Then a spacer feature is formed surrounding the dummy gate stack. After source/drain features are formed adjacent to the spacer feature, the dummy gate stack is removed, leaving an opening surrounded by the spacer. Finally, a metal gate is formed in the opening. The metal gate includes a gate dielectric layer such as a high-k dielectric layer, a barrier layer, and a work function metal layer. Multiple patterning processes may be used to form the work function metal layer, for example, to fine tune threshold voltage (Vt) of the transistor. An objective of the barrier layer is to protect the gate dielectric layer during the patterning processes. However, some conventional etchants such as SC-1 (Standard Clean 1) and SC-2 (Standard Clean 2) have poor etch selectivity. As a result, the barrier layer may be inadvertently etched, losing its effectiveness as a protection layer. Embodiments of the present disclosure address such an issue.

Referring now to FIG. 1, a flow chart of a method 10 of forming a semiconductor device is illustrated according to various aspects of the present disclosure. The method 10 is merely an example, and is not intended to limit the present disclosure beyond what is explicitly recited in the claims. Additional operations can be provided before, during, and after the method 10, and some operations described can be replaced, eliminated, or moved around for additional embodiments of the method. The method 10 is described below in conjunction with FIGS. 2-14 that illustrate a portion of a semiconductor device 100 at various fabrication stages. The device 100 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 2:
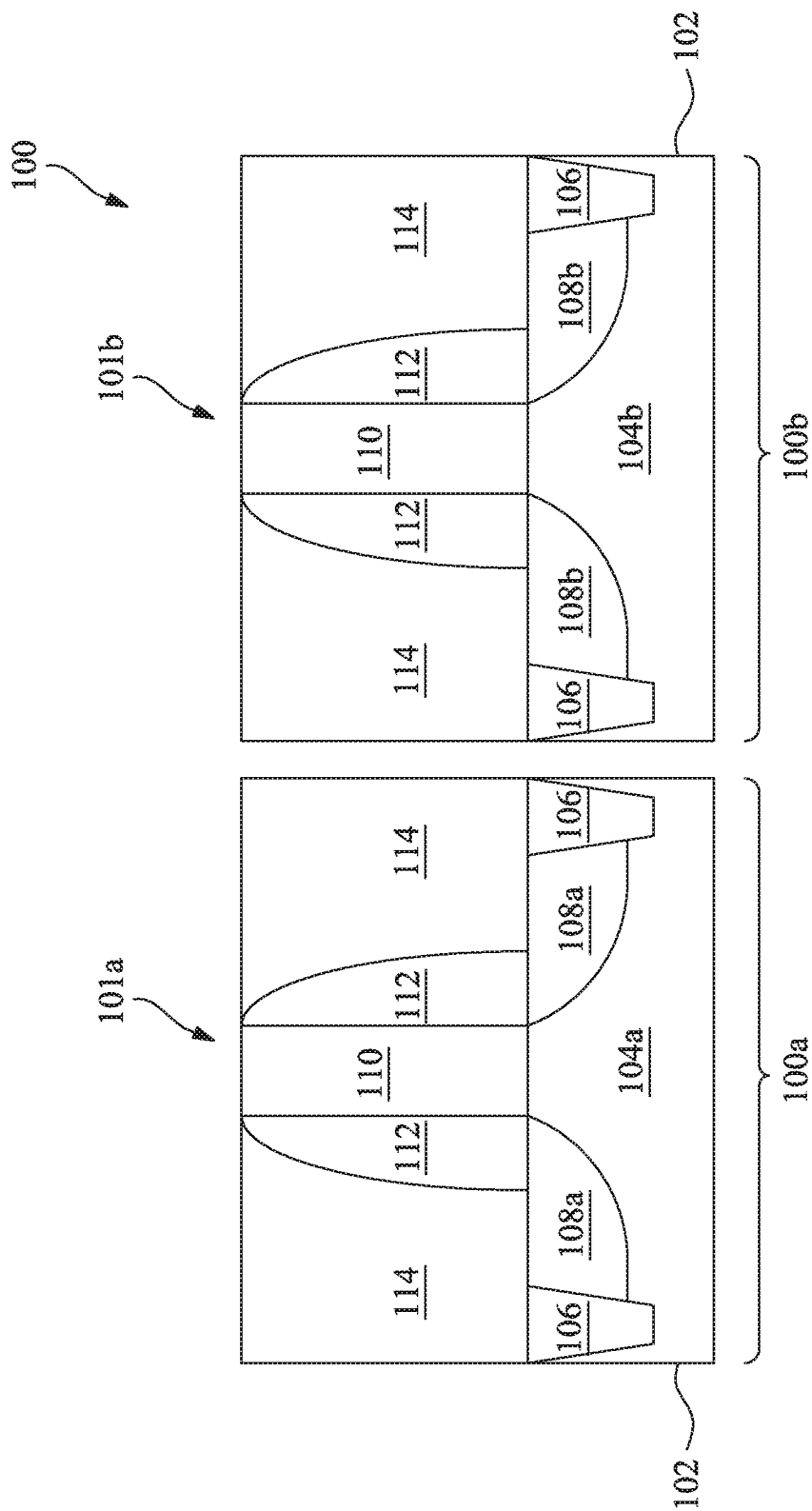
FIGS. 2-14 are cross sectional views of forming a semiconductor device according to the method of FIG. 1, in accordance with some embodiments.
Figure 14:
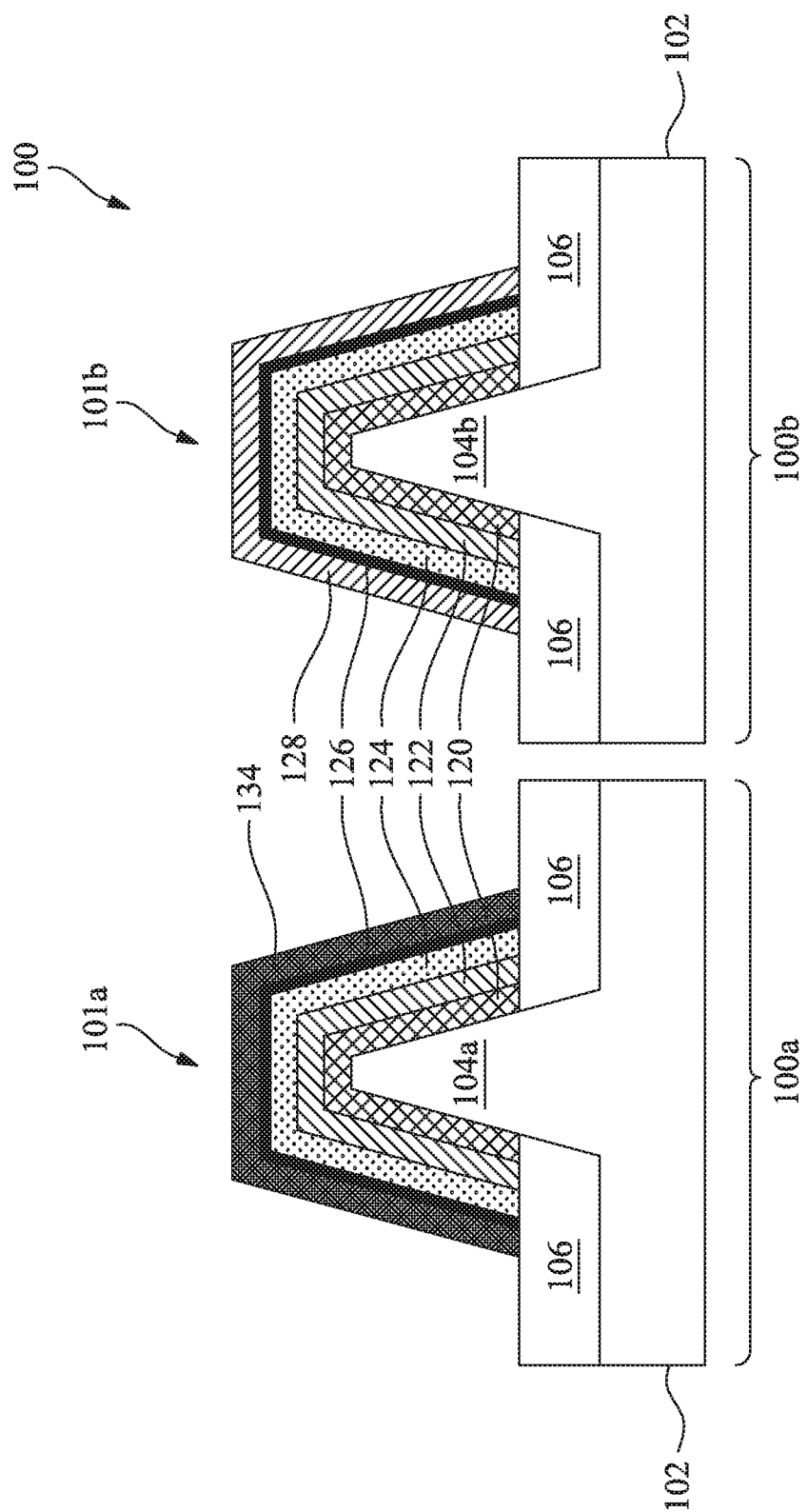

At operation 12, the method 10 (FIG. 1) receives a substrate 102 with various structures formed therein and/or thereon. Referring to FIG. 2, the device 100 includes the substrate 102 and isolation structures 106 over the substrate 102. The isolation structures 106 separate the device 100 into various device regions. In the example as shown, there is an n-FET device region 100a and a p-FET device region 100b. In the present embodiment, the device 100 includes FinFETs and the substrate 102 includes two active fins 104a and 104b that project upwardly through the isolation structures 106. The two fins 104a and 104b are in the device regions 100a and 100b respectively. To further this embodiment, FIGS. 2-13 are schematic cross sectional views of the device 100 along a fin length direction of the respective fins 104a/b, while FIG. 14 is a schematic cross sectional view of the device 100 along a fin width direction of the respective fins 104a/b. In various embodiments, the device regions 100a and 100b can be contiguous or non-contiguous. The present disclosure is not limited to any particular number of devices or device regions, or to any particular device configurations.

The device 100 further includes gate structures 101a and 101b in the device regions 100a and 100b respectively. The gate structures 101a and 101b each include a dummy gate stack 110 and a spacer feature 112 on sidewalls of the dummy gate stack 110. The gate structures 101a and 101b each engage a portion of the active fins 104a and 104b respectively. The device 100 further includes source/drain regions 108a and 108b in the respective actin fins 104a and 104b, disposed on opposite sides of the respective gate structures 101a and 101b. The device 100 further includes an inter-layer dielectric (ILD) layer 114 surrounding the gate structures 101a and 101b. The various aforementioned structures of the device 100 will be further described below.

The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) such as a buried dielectric layer.

In the present embodiment, the fin 104a is suitable for forming an n-type FinFET, and the fin 104b is suitable for forming a p-type FinFET. This configuration is for illustrative purposes only and does not limit the present disclosure. The fins 104a/b may be fabricated using suitable processes including photolithography and etch processes. The photolithography process may include forming a photoresist layer (resist) overlying the substrate 102, exposing the resist to a pattern, performing post-exposure bake processes, and developing the resist to form a masking element including the resist. The masking element is then used for etching recesses into the substrate 102, leaving the fins 104a/b on the substrate 102 (See, FIG. 14). The etching process can include dry etching, wet etching, reactive ion etching (RIE), and/or other suitable processes. Alternatively, the fins 104a/b may be formed using mandrel-spacer double patterning lithography. Numerous other embodiments of methods to form the fins 104a/b may be suitable.

The isolation structures 106 may be formed of silicon oxide, silicon nitride, silicon oxynitride, fluoride-doped silicate glass (FSG), a low-k dielectric material, and/or other suitable insulating material. The isolation structures 106 may be shallow trench isolation (STI) features. In an embodiment, the isolation structures 106 is formed by etching trenches in the substrate 102, e.g., as part of the fins 104a/b formation process. The trenches may then be filled with isolating material, followed by a chemical mechanical planarization (CMP) process. Other isolation structure such as field oxide, LOCal Oxidation of Silicon (LOCOS), and/or other suitable structures are possible. The isolation structure 106 may include a multi-layer structure, for example, having one or more thermal oxide liner layers.

The dummy gate stacks 110 engage the fins 104a/b on two or three sides of the fins in the present embodiment. It is termed "dummy" because it will be removed in a later step and will be replaced with a "real" gate stack such as a high-k metal gate in a "gate-last" process. The dummy gate stacks 110 may include one or more material layers, such as an oxide layer, a poly-silicon layer, a hard mask layer, a capping layer, and other suitable layers. The various layers in the dummy gate stacks 110 may be formed by suitable deposition techniques. For example, the oxide layer may be formed by chemical oxidation, thermal oxidation, atomic layer deposition (ALD), chemical vapor deposition (CVD), and/or other suitable methods. For example, the poly-silicon layer may be formed by suitable deposition processes such as low-pressure chemical vapor deposition (LPCVD) and plasma-enhanced CVD (PECVD). In an embodiment, the dummy gate stacks 110 are first deposited as blanket layers. Then the blanket layers are patterned through a process including photolithography processes and etching processes thereby removing portions of the blanket layers and keeping the remaining portions over the isolation structure 106 and the fins 104a/b as the dummy gate stacks 110.

The spacer feature 112 is formed on sidewalls of the dummy gate stack 110. The spacer feature 112 includes a material different from the material(s) for the dummy gate stack 110. In an embodiment, the spacer feature 112 includes a dielectric material, such as silicon nitride or silicon oxynitride. In an example, the spacer feature 112 includes multiple layers, such as a seal layer adjacent to the dummy gate stacks 110 and a main spacer layer adjacent to the seal layer. In an embodiment, after the dummy gate stacks 110 have been formed, one or more spacer layers are formed by blanket depositing spacer materials over the device 100. Then, an anisotropic etching process is performed to remove portions of the spacer layers to form the spacer feature 112 as illustrated in FIG. 2.

The source/drain regions 108a and 108b may include source/drain features and may be formed by various techniques, such as etching processes followed by one or more epitaxy processes. In one example, one or more etching processes are performed to remove portions of the fins 104a/b to form recesses therein. A cleaning process may be performed that cleans the recesses with a hydrofluoric acid (HF) solution or other suitable solution. Subsequently, one or more epitaxial growth processes are performed to grow silicon features in the recesses. The epitaxial growth process may in-situ dope the grown silicon with a p-type dopant for forming a p-type FinFET or an n-type dopant for forming an n-type FinFET.

The ILD layer 114 is formed over the substrate 102. In embodiments, the device 100 further includes a contact etch stop layer underneath the ILD layer 114. The ILD layer 114 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 114 may be deposited by a PECVD process or other suitable deposition technique. In an embodiment, the ILD layer is formed by a flowable CVD (FCVD) process. The FCVD process includes depositing a flowable material (such as a liquid compound) on the substrate 102 to fill trenches and converting the flowable material to a solid material by a suitable technique, such as annealing in one example. After various deposition processes, a chemical mechanical planarization (CMP) process is performed to planarize a top surface of the dielectric layer 114 and to expose a top surface of the dummy gate stacks 110 for subsequent fabrication steps.

Figure 3:
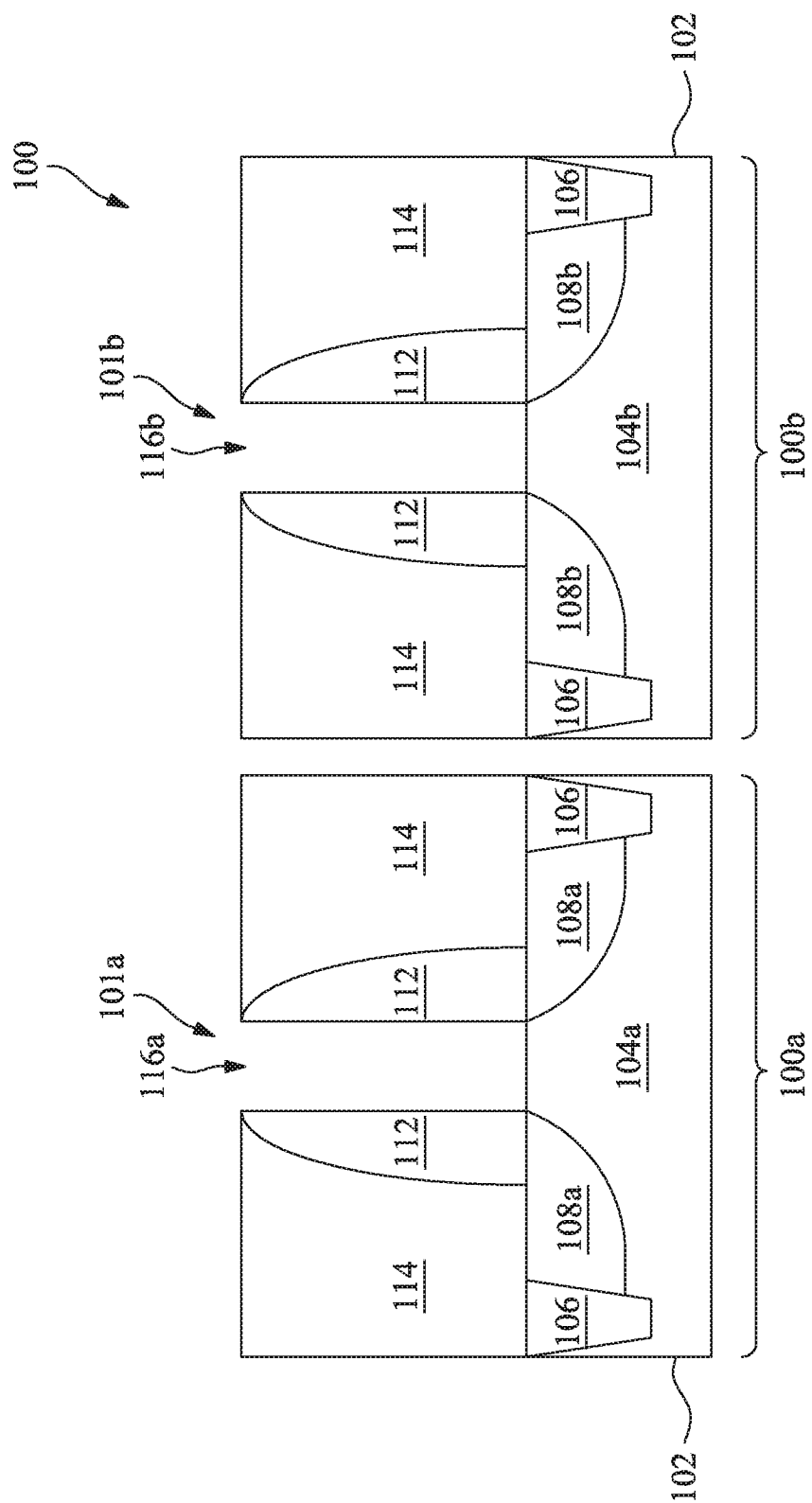

At operation 14, the method 10 (FIG. 1) removes the dummy gate stacks 110. Referring to FIG. 3, two trenches 116a and 116b are thereby formed in the gate structures 101a and 101b respectively, exposing the fins 104a and 104b there through. The trenches 116a/b are surrounded by structures discussed above, such as the spacer feature 112 and the ILD layer 114. In an embodiment, operation 14 includes one or more etching processes that are selectively tuned to remove the dummy gate stacks 110 (FIG. 2) while the spacer feature 112 and the ILD layer 114 substantially remain. The etching processes may include a suitable wet etch, dry (plasma) etch, and/or other processes. For example, a dry etching process may use chlorine-containing gases, fluorine-containing gases, other etching gases, or a combination thereof. The wet etching solutions may include $NH_4OH$, HF (hydrofluoric acid) or diluted HF, deionized water, TMAH (tetramethylammonium hydroxide), other suitable wet etching solutions, or combinations thereof.

Figure 4:
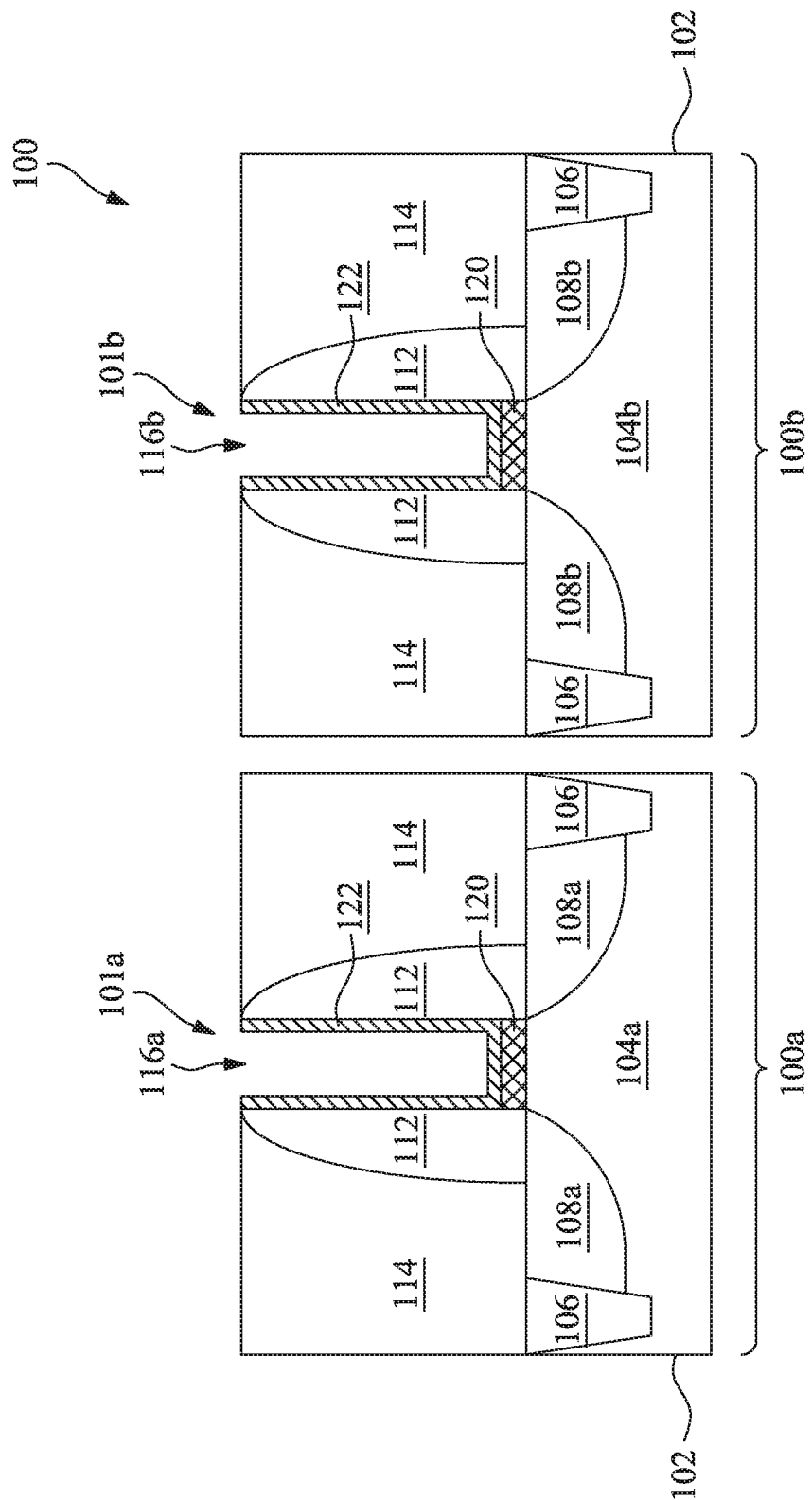

At operation 16, the method 10 (FIG. 1) forms a gate dielectric layer 122 in the trenches 116a/b. Referring to FIG. 4, in the present embodiment, the method 10 also forms an interfacial layer 120 underneath the gate dielectric layer 122. For example, the interfacial layer 120 may include a dielectric material such as silicon oxide layer ($SiO_2$) or silicon oxynitride (SiON), and may be formed by chemical oxidation, thermal oxidation, atomic layer deposition (ALD), CVD, and/or other suitable dielectric. In the present embodiment, the gate dielectric layer 122 includes a high-k dielectric material such as hafnium oxide ($HfO_2$), $Al_2O_3$, lanthanide oxides, $TiO_2$, $HfZrO$, $Ta_2O_3$, $HfSiO_4$, $ZrO_2$, $ZrSiO_2$, combinations thereof, or other suitable material. The gate dielectric layer 122 may be formed by ALD and/or other suitable methods.

Figure 5:
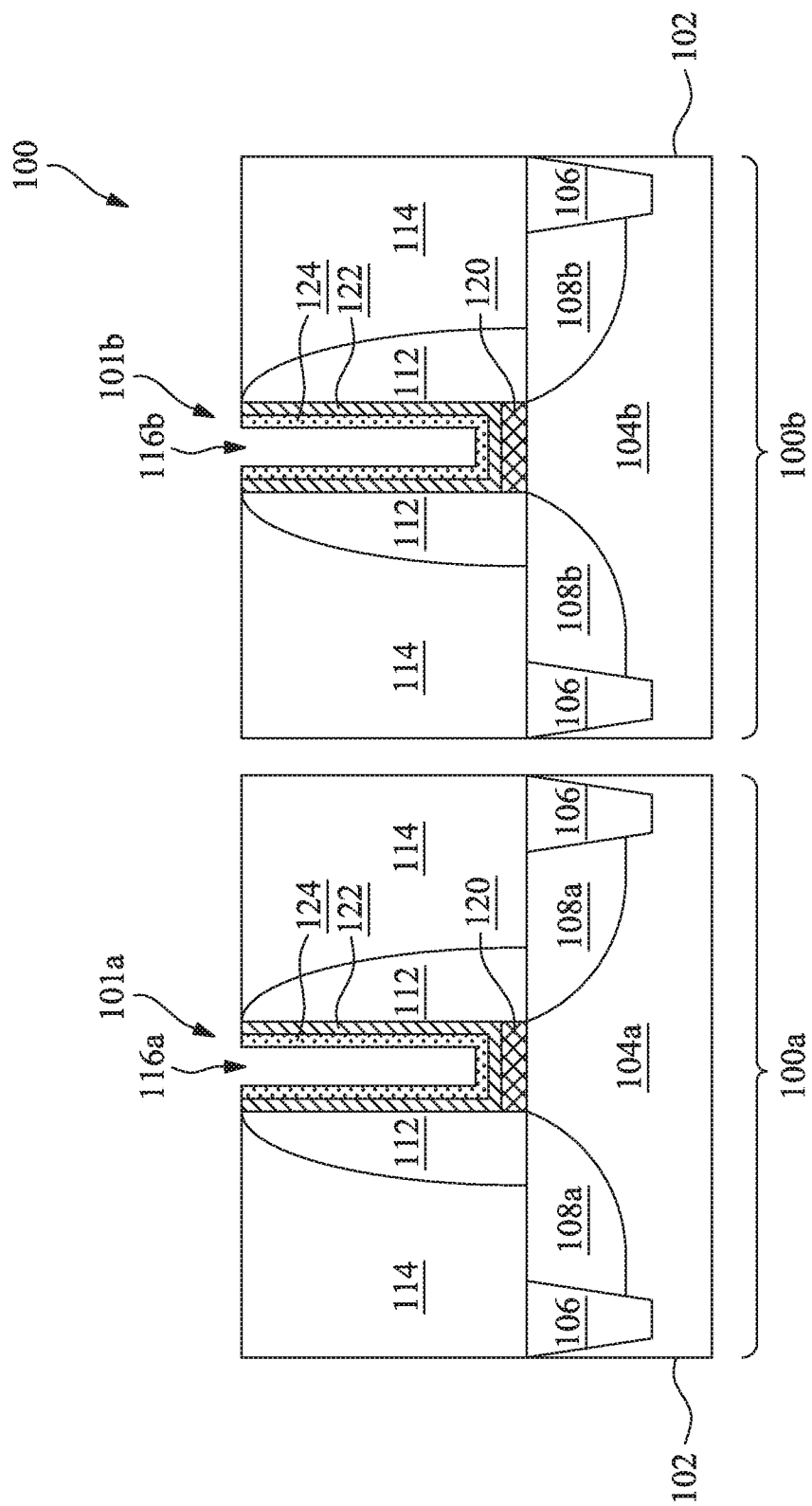

At operation 18, the method 10 (FIG. 1) forms a barrier layer 124 in the trenches 116a/b. Referring to FIG. 5, the barrier layer 124 is also called a metal barrier layer or a metal blocking layer. The barrier layer 124 is formed over the gate dielectric layer 122, and is intended to protect the gate dielectric layer 122 from metal impurities introduced in later steps. For example, in the present embodiment, the gate structures 101a/b will be formed to include one or more work function metal layers. Without the barrier layer 124, metal materials from those work function metal layers would diffuse into the gate dielectric layer 122, causing manufacturing defects. In various embodiments, the barrier layer 124 includes a metal element. In the present embodiment, the barrier layer 124 includes tantalum nitride. In another embodiment, the barrier layer 124 includes titanium nitride. In yet another embodiment, the barrier layer 124 includes niobium nitride. Various other materials are suitable. In an embodiment, the barrier layer 124 is formed by ALD, PVD, CVD, or other suitable methods. In the present embodiment, the barrier layer 124 has a thickness about 5 to about 20 Å.

It has been observed that, in some instances, the barrier layer 124 alone may not provide sufficient protection to the gate dielectric layer 122. In one instance, multiple metal patterning processes are performed in the trenches 116a/b in order to form a work function metal layer over the barrier layer 124. This may be for fine tuning threshold voltage (Vt) of the FinFETs, as an example. In another instance, a p-type work function metal is simultaneously deposited into the trenches 116a and 116b when forming a p-FET in the device region 100i). The p-type work function metal in the trench 116a is thereafter replaced with an n-type work function metal in order to form an n-FET in the device region 100a. In either instance above, the barrier layer 124 may be undesirably etched during the metal patterning/removal processes, due in part to poor etch selectivity of the etchant used for the patterning/removing of the metal layers. When the barrier layer 124 is etched and compromised, metal materials would contaminate the gate dielectric layer 122, causing device defects. The present disclosure provides structures and methods to reinforce the protection to the gate dielectric layer 122.

Figure 6:
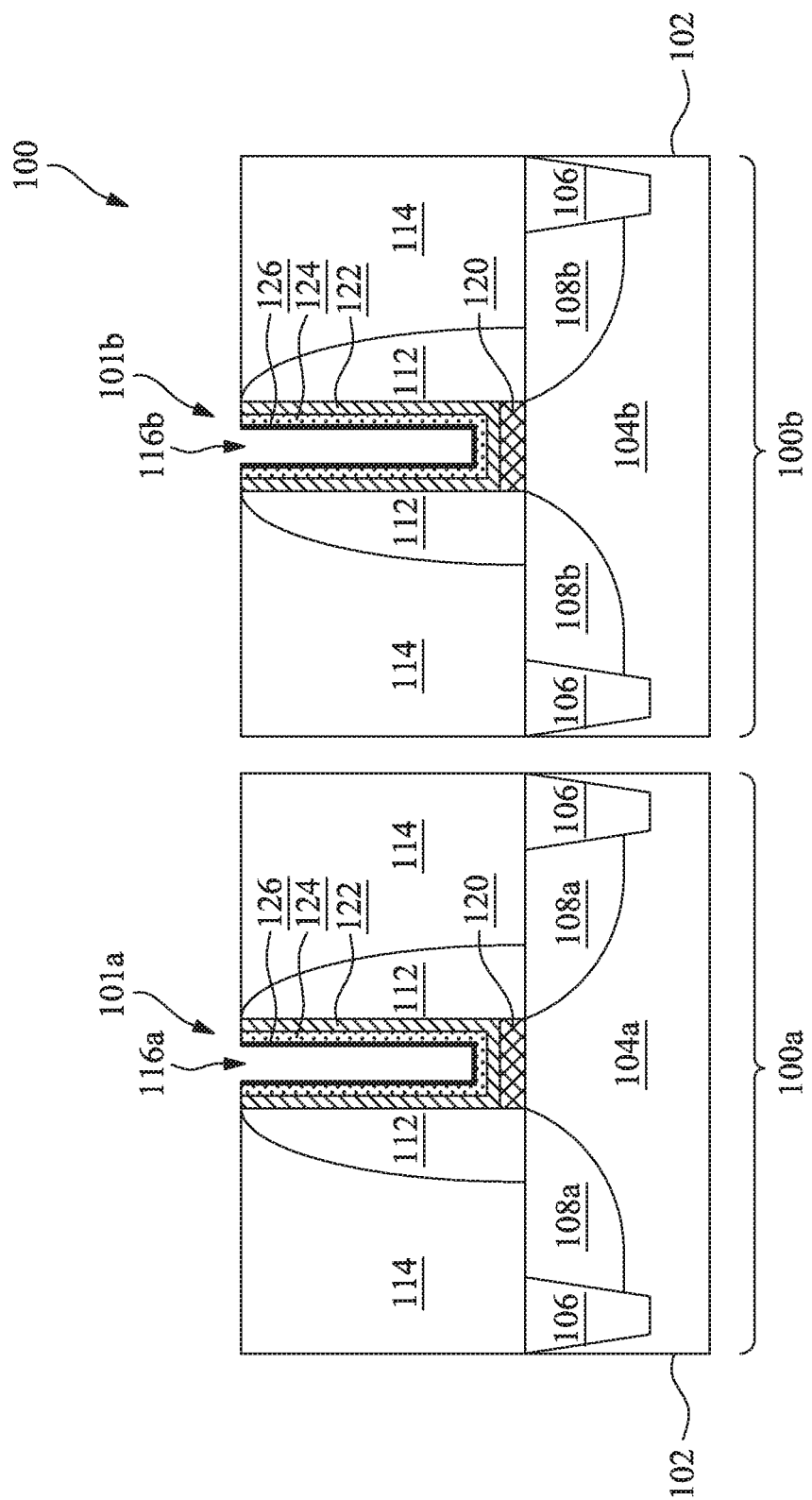

At operation 20, the method 10 (FIG. 1) forms an oxide layer 126 over the barrier layer 124. Referring to FIG. 6, the oxide layer 126 is formed in the trenches 116a/b, covering the barrier layer 124. The benefits of the oxide layer 126 will be explained in a later step. The oxide layer 126 may be formed by a variety of processes.

In an embodiment, the oxide layer 126 is formed by treating the barrier layer 124 with a flow of oxygen. To further this embodiment, the barrier layer 124 and the oxide layer 126 contain a common metal element. In an embodiment, the barrier layer 124 includes tantalum nitride and the oxide layer 126 includes tantalum oxide. In another embodiment the barrier layer 124 includes titanium nitride and the oxide layer 126 includes titanium oxide. In yet another embodiment, the barrier layer 124 includes niobium nitride and the oxide layer 126 includes niobium oxide. In an embodiment, oxygen treatment of the barrier layer 124 is performed in a dry etching tool. Alternatively, it may be performed in a dry ashing tool. In an embodiment, the oxygen treatment is performed under a pressure of about 1.5 mTorr, at a temperature of about 30 to about 60 degrees Celsius, with an oxygen flow of about 1 to about 100 mL/min, such as about 30 mL/min, and for about 5 to about 30 seconds. The oxide layer 126 may be formed to about 5 to about 20 Å. However, other thickness may also be suitable.

In another embodiment, the oxide layer 126 is formed by one or more deposition processes. To further this embodiment, the barrier layer 124 and the oxide layer 126 may contain the same or different metal elements. For example, a layer of tantalum oxide (e.g., $Ta_2O_5$) may be deposited over the barrier layer 124 under a pressure of about 1 to about 100 Torr, at a temperature of about 250 to about 400 degrees Celsius, and with tantalum tetraethoxy dimethylaminoethoxide as precursor gas and argon as carrier gas. For example, the flow rate of the precursor gas may be set to about 20 standard cubic centimeters per minute (sccm). In embodiments, deposition of titanium oxide or niobium oxide may be similarly performed. However, other suitable deposition techniques can also be used.

In various embodiments, the thickness of the various layers 120, 122, 124, and 126 may be tuned for pFET devices and for nFET devices separately.

Figure 7:
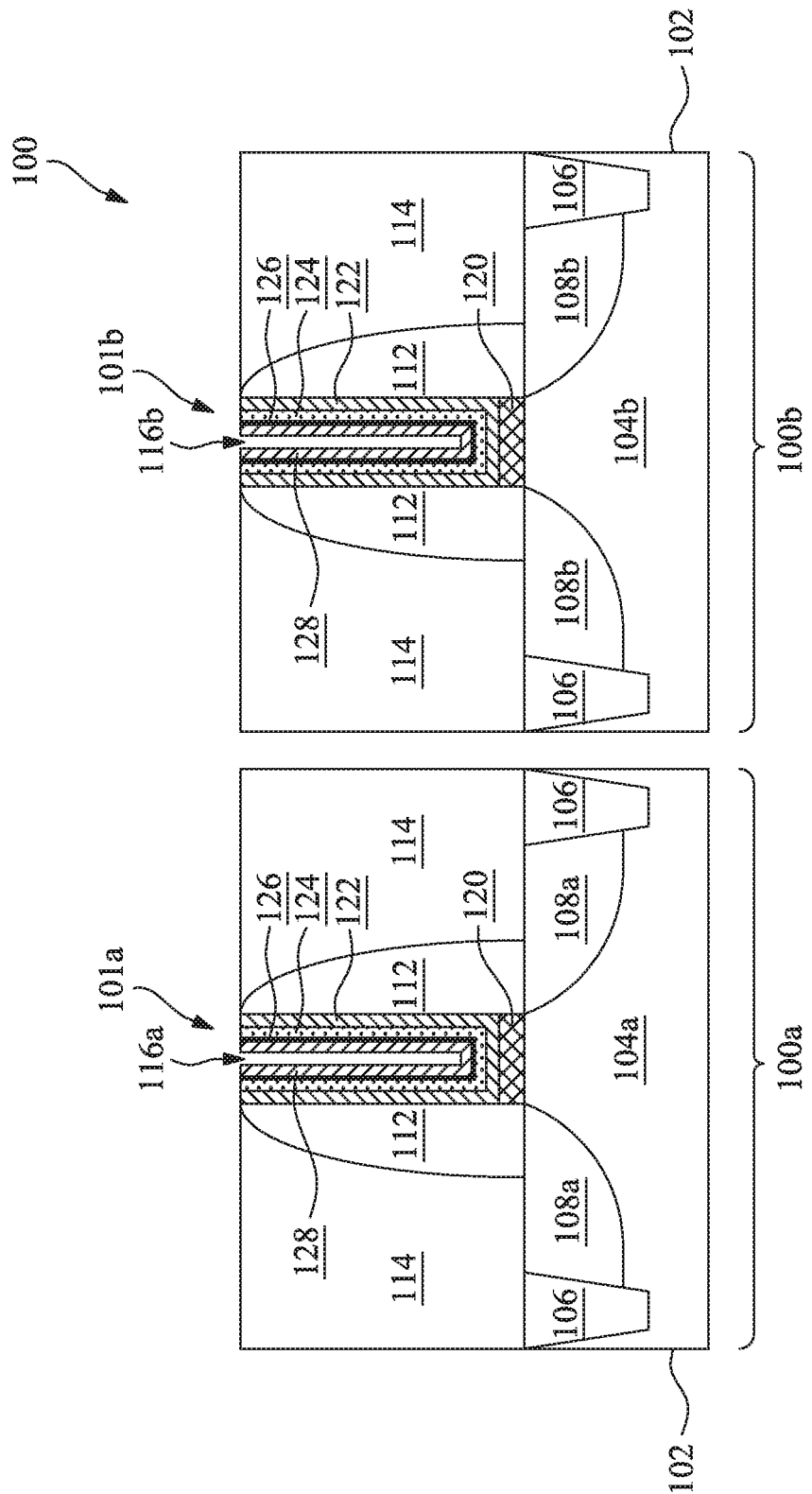

At operation 22, the method 10 (FIG. 1) forms a work function metal layer 128 over the oxide layer 126. Referring to FIG. 7, the work function metal layer 128 is formed in the trenches 116a/b, covering the oxide layer 126. The work function metal layer 128 may be a p-type or an n-type work function metal layer. Exemplary p-type work function metals include TiN, TaN, Ru, Mo, Al, WN, ZrSi$_2$, MoSi$_2$, TaSi$_2$, NiSi$_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function metal layer 128 may include a plurality of layers and may be deposited by CVD, PVD, and/or other suitable process. In the present embodiment, the work function metal layer 128 includes a p-type work function material that is suitable for forming a pFET in the device region 100b. For example, a titanium-containing material may be used for the work function metal layer 128 where the oxide layer 126 includes tantalum oxide. Even though the work function metal layer 128 is not intended for the nFETs in the device region 100a, it is nonetheless deposited into both the trenches 116a and 116b. One consideration is that selectively depositing the work function metal layer 128 might require part of the device 100 to be covered with an organic material, such as a photoresist (or resist), that might contaminate the work function metal layer during deposition. Therefore, depositing the work function metal layer 128 simultaneously into the trenches 116a/b simplifies process and improves film purity.

At operation 24, the method 10 (FIG. 1) removes the work function metal layer 128 from the trench 116a. This involves multiple steps, which will be explained in conjunction with FIGS. 8-11.

Figure 8:
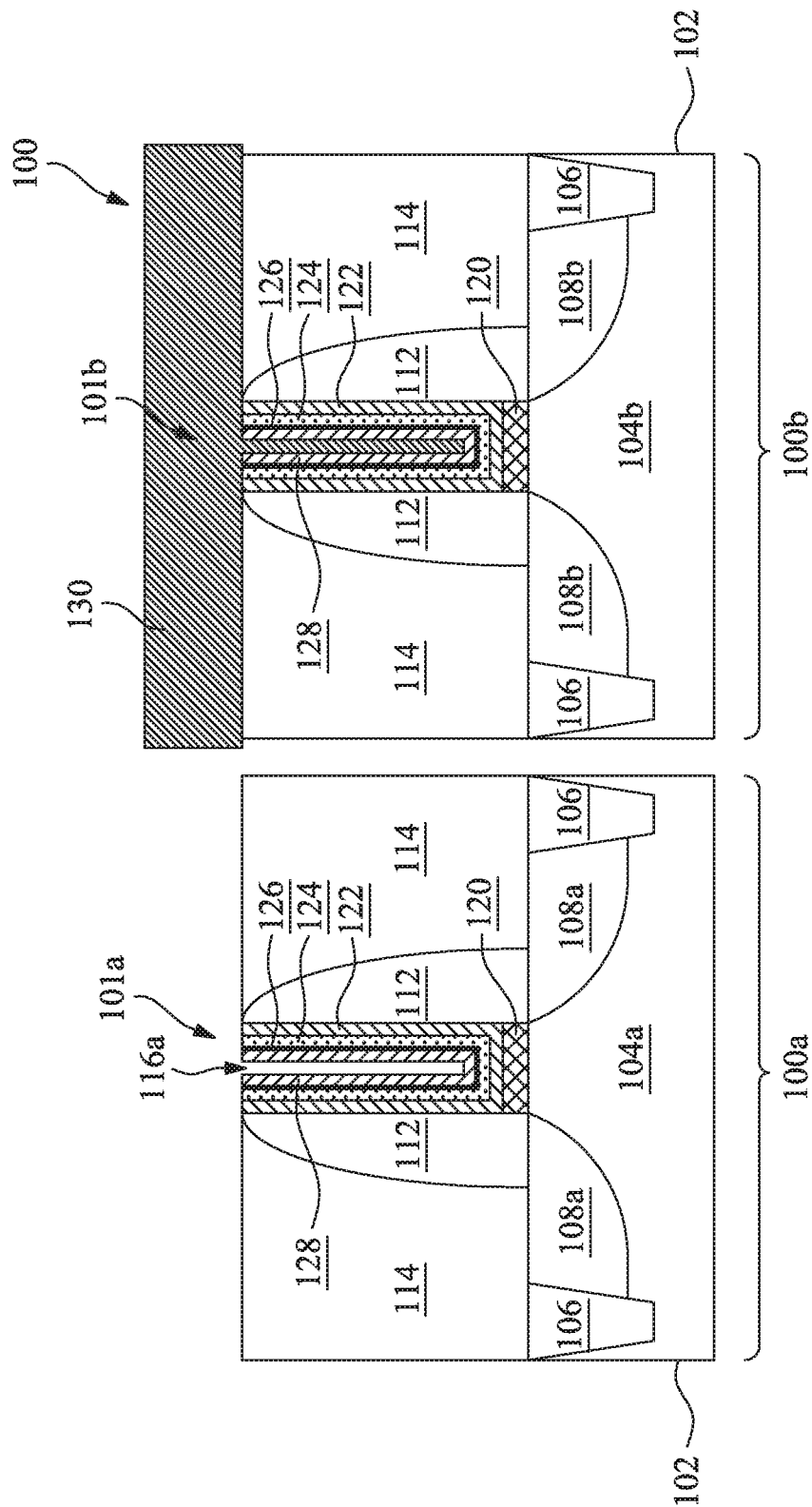

Referring to FIG. 8, the method 10 forms a masking element 130 covering the device region 100b. In an embodiment, the masking element 130 includes a resist patterned with a photolithography process and may further include a resist under-layer such as a bottom anti-reflective coating (BARC). The photolithography process may include forming a resist layer overlying the substrate 102, exposing the resist to a pattern, performing post-exposure bake processes, and developing the resist to remove its portion over the device region 100a and to form the masking element 130.

Figure 9:
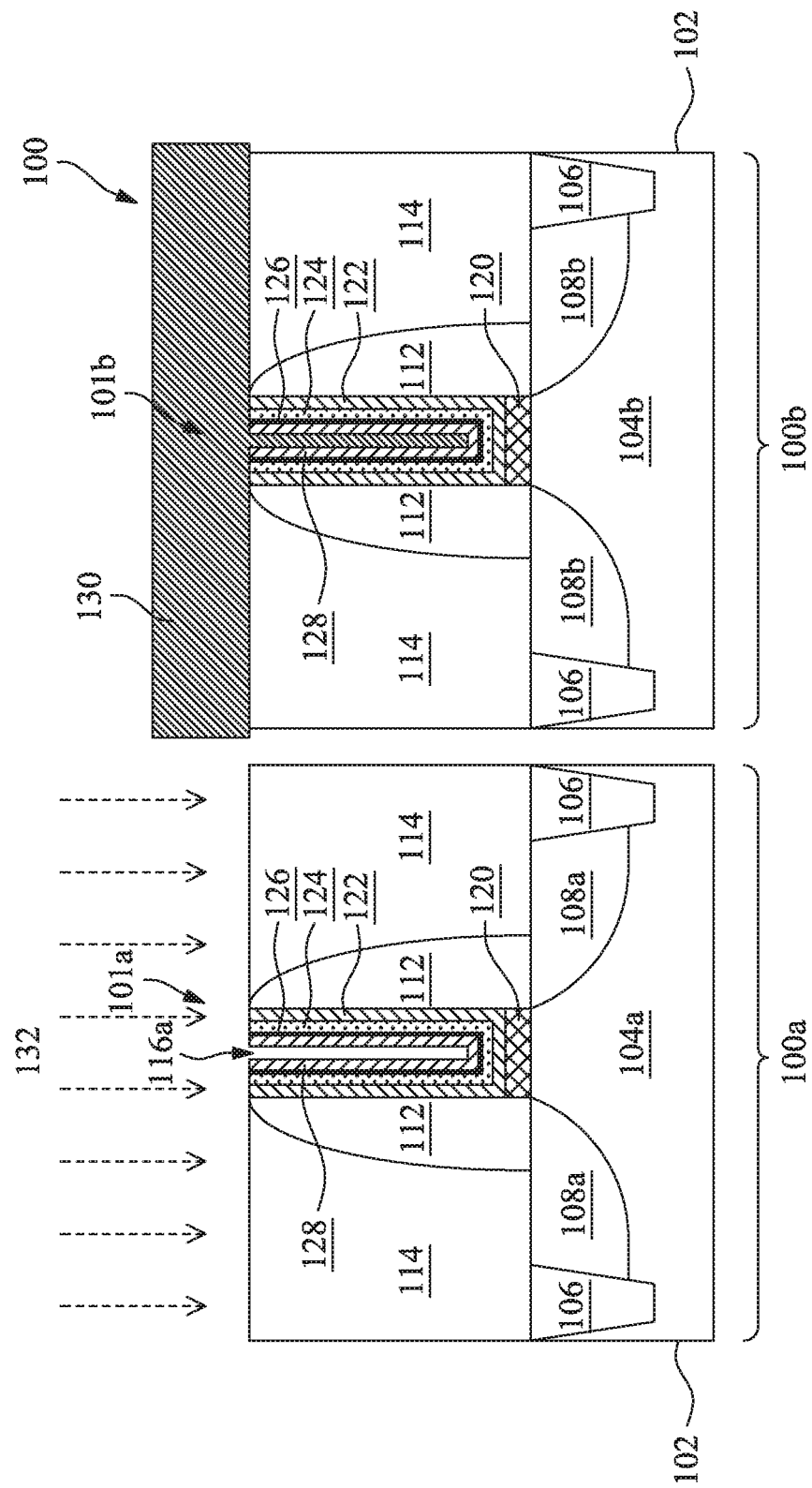
Figure 10:
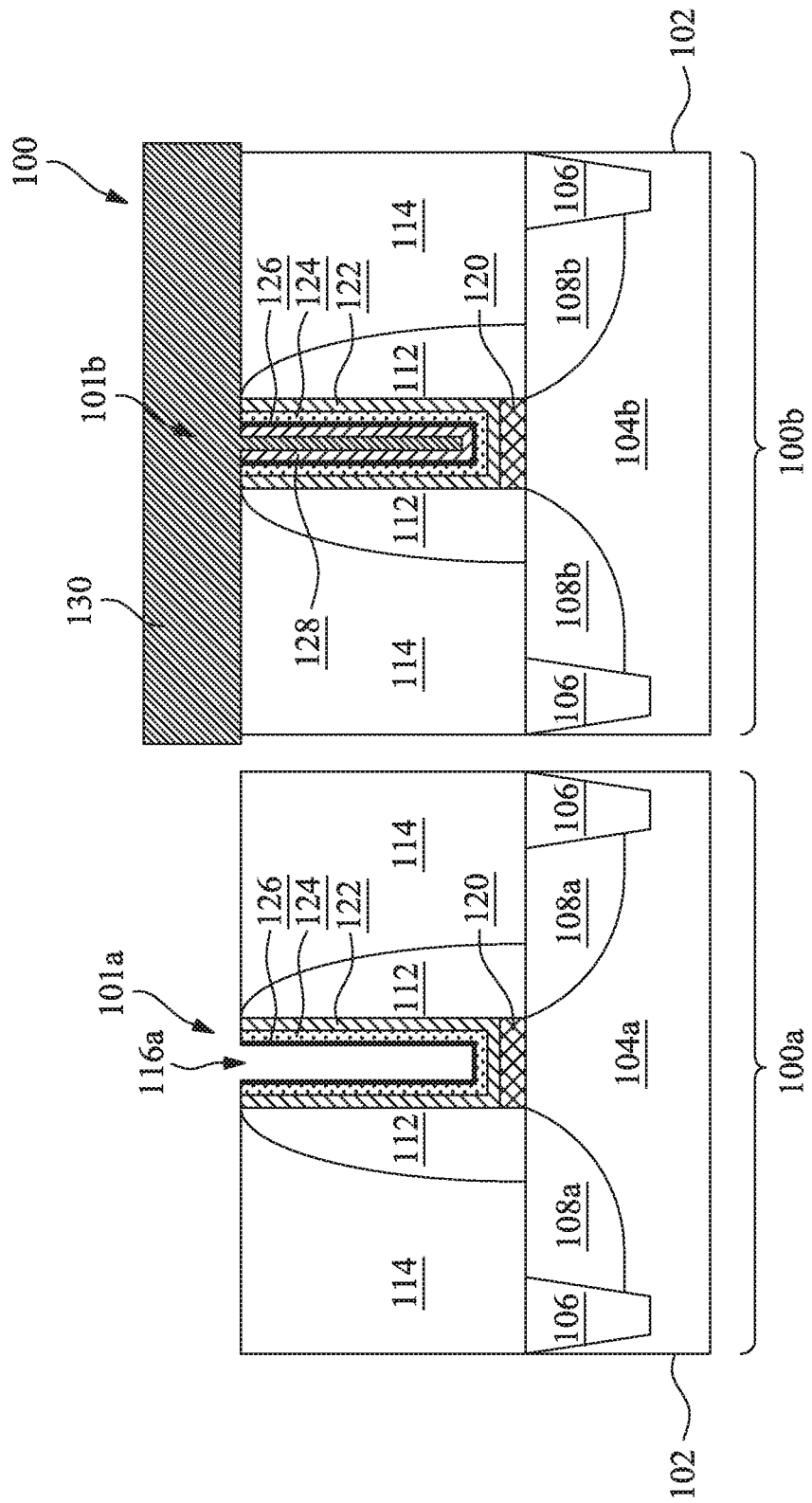

Referring to FIG. 9, the method 10 performs an etching process to remove the work function metal layer 128 from the trench 116a. The etching process uses an etchant 132. In an embodiment, the etchant 132 includes phosphoric acid (or orthophosphoric acid), such as 85 weight percent (85 wt. %) of H$_3$PO$_4$ in an aqueous solution (e.g., H$_2$O). To further this embodiment, the etchant 132 is a mixture of phosphoric acid with other components such as hydrogen peroxide (H$_2$O$_2$), Nitric acid (HNO$_3$), Sulfuric acid (H$_2$SO$_4$), deionized water (DIW), ammonium hydroxide (NH$_4$OH), ozone (O$_3$), hydrofluoric acid (HF), hydrochloric acid (HCl), other acidic solutions and organic oxidizer, or a combination thereof. In embodiments, the ratio of phosphoric acid in the mixture is about 1:5 to about 1:50.

In various embodiments, the etching process may be performed at a temperature of about 20 to about 80 degrees Celsius. The oxide layer 126 prevents the etchant 132 from etching the barrier layer 124. In various embodiments, upon the removal of the work function metal layer 128, self-assembled monolayers are formed on the surface of the oxide layer 126 as a result of phosphoric acid chelating. The monolayers prevent the phosphoric acid from penetrating the oxide layer 126. In an embodiment, the oxide layer 126 includes tantalum oxide (e.g., Ta$_2$O$_5$). To further this embodiment, the monolayers may include closely packed octadecylphosphate (ODP) molecules coordinated onto tantalum oxide, wherein more than one phosphate head group may be coordinated to one tantalum ion and forming monodentate and bi-dentate complexes to protect the oxidized layer as shown in the following formula:

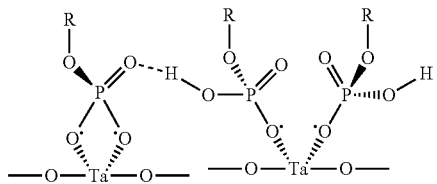

The formation of such monolayers is discussed in Marcus Textor et al, "Structural Chemistry of Self-Assembled Monolayers of Octadecylphosphoric Acid on Tantalum Oxide Surfaces," *Langmuir* 2000, 16, 3257-3271 and Dorothee Brovelli et al. "Highly Oriented, Self-Assembled Alkanephosphate Monolayers on Tantalum(V) Oxide Surfaces," *Langmuir* 1999, 15, 4324-4327.

In another embodiment, the oxide layer 126 includes titanium oxide (e.g., TiO$_2$) or niobium oxide (e.g., Nb$_2$O$_5$). Phosphate monolayers may be similarly formed on the surface of the oxide layer 126 upon the removal of the work function metal layer 128. The formation of such phosphate monolayers is discussed in S. Tosatti et al. "Self-Assembled Monolayers of Dodecyl and Hydroxy-dodecyl Phosphates on Both Smooth and Rough Titanium and Titanium Oxide Surfaces," *Langmuir* 2002, 18, 3537-3548 and Flavio A. Pavan et al. "Adsorption of Phosphoric Acid on Niobium Oxide Coated Cellulose Fiber: Preparation, Characterization and Ion Exchange Property," *J. Braz. Chem. Soc.*, Vol. 16, No. 4, 815-820 (2005).

As a result of the bonding of the oxide layer 126 with components of the etchant 132, the etching of the work function metal layer 128 in the trench 116a automatically stops at the oxide layer 126. In embodiments, the method 10 further includes a rinse process to remove etching residues, such as phosphate monolayers, from the trench 116a. For example, the rinse process may use a solution containing DIW, carbonized DIW such as DIW with carbon dioxide, or DIW with diluted NH$_4$OH. The rinse process may be performed at a temperature of about 20 to about 80 degrees Celsius. In embodiments, the method 10 further includes a drying process to dry the surface of the oxide layer 126. For example, the drying process may include a spin drying of the device 100 in the presence of a flow of nitrogen. For example, the drying process may include an isoprophyl alcohol (IPA) drying process. A shown in FIG. 10, the work function metal layer 128 has been removed from the trench 116a, exposing the surface of the oxide layer 126 therein. Afterwards, the method 10 removes the masking element 130 from the device region 100b using a process such as resist stripping or ashing. In embodiments, the removal of the masking element 130 may be performed before the rinse process and the dry process discussed above.

Figure 11:
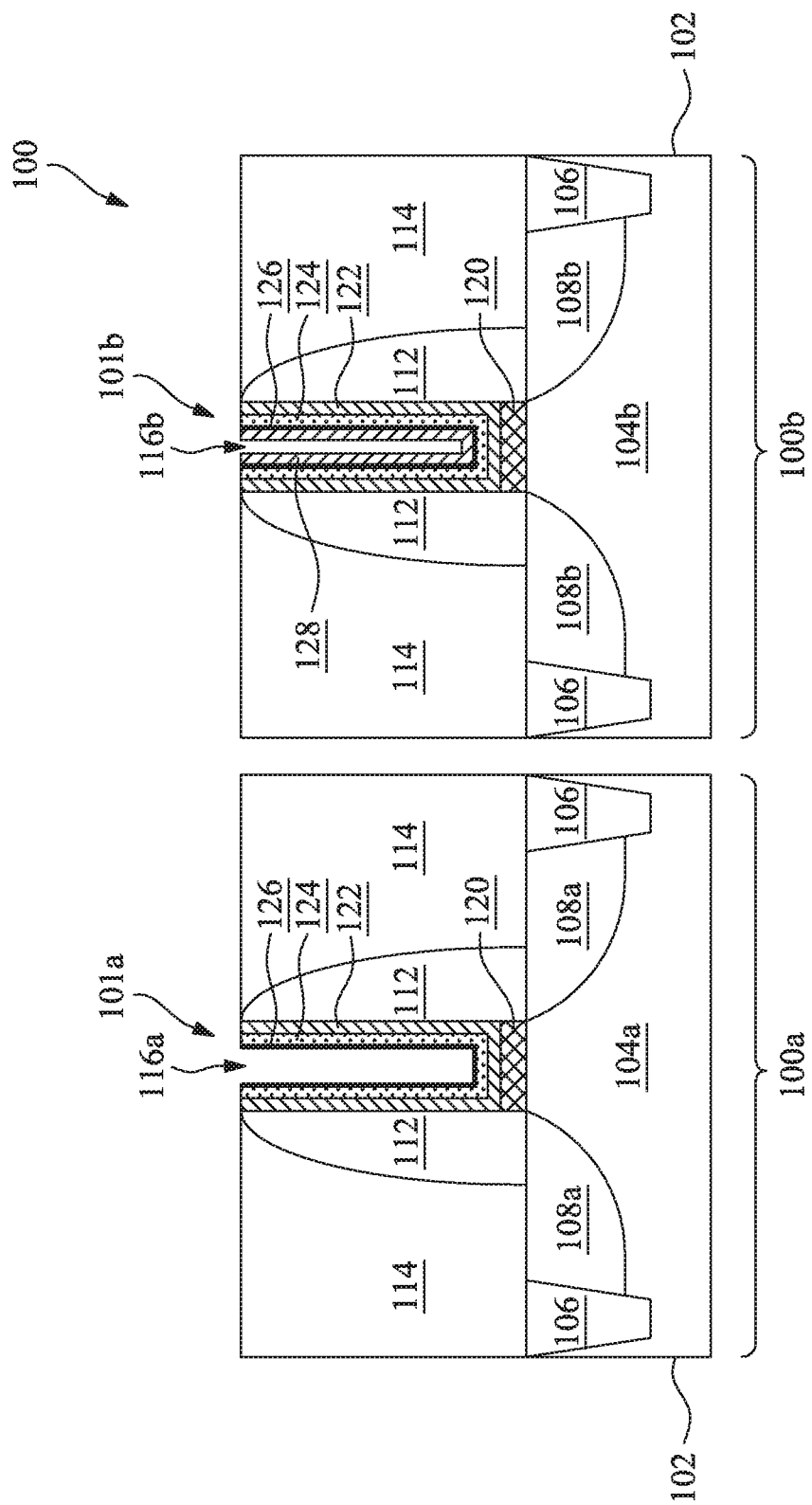

After operation 24, the work function metal layer 128 is removed from the trench 116a but remains in the trench 116b, as shown in FIG. 11. Referring to FIG. 11, the oxide layer 126 remains substantially intact in the trench 100a and the barrier layer 124 is not etched during the work function metal patterning process. Advantageously, the oxide layer 126 and the barrier layer 124 provide metal blocking capability so as to ensure the purity of gate dielectric layer 122.

Figure 12:
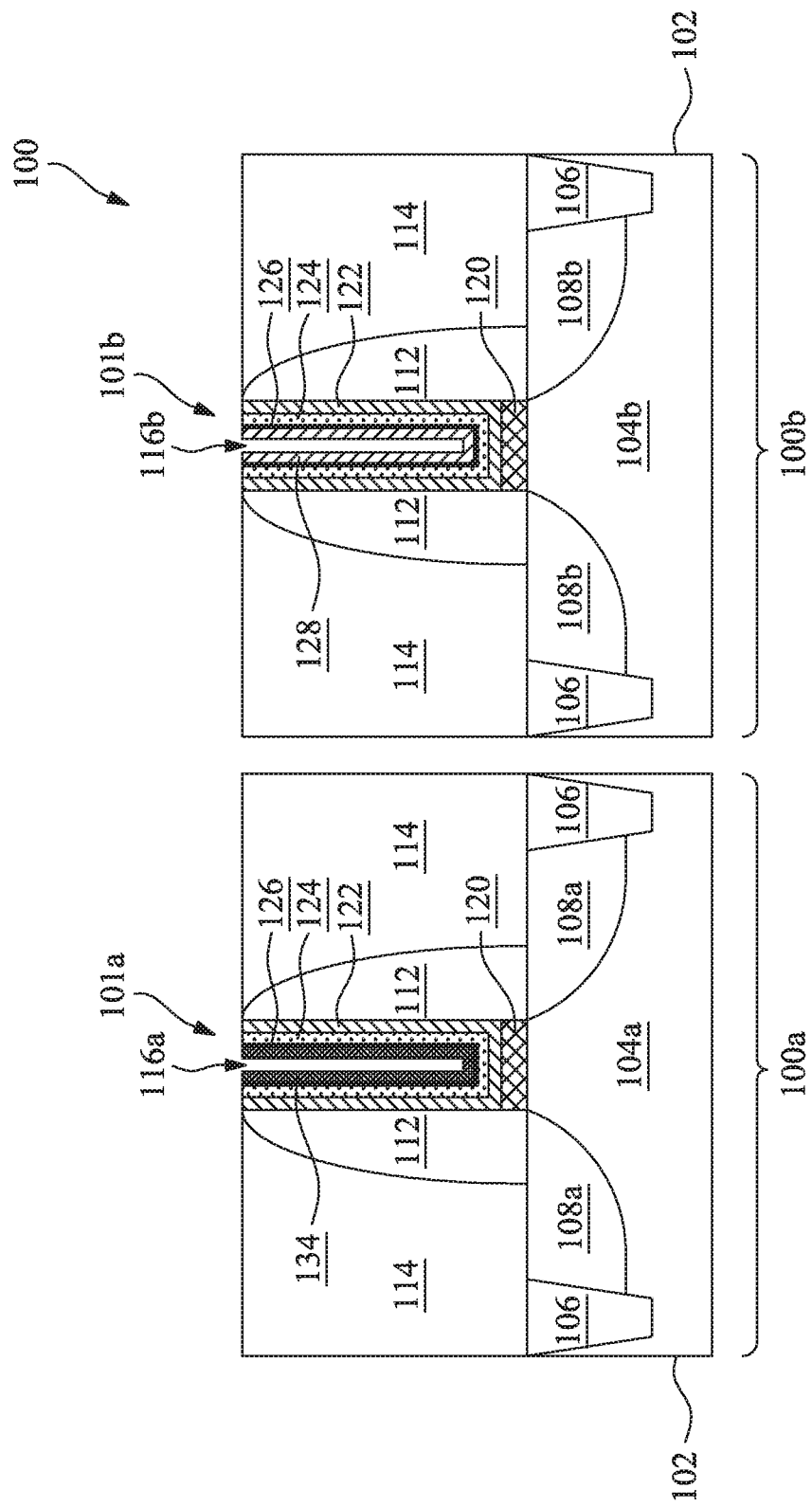
Figure 13:
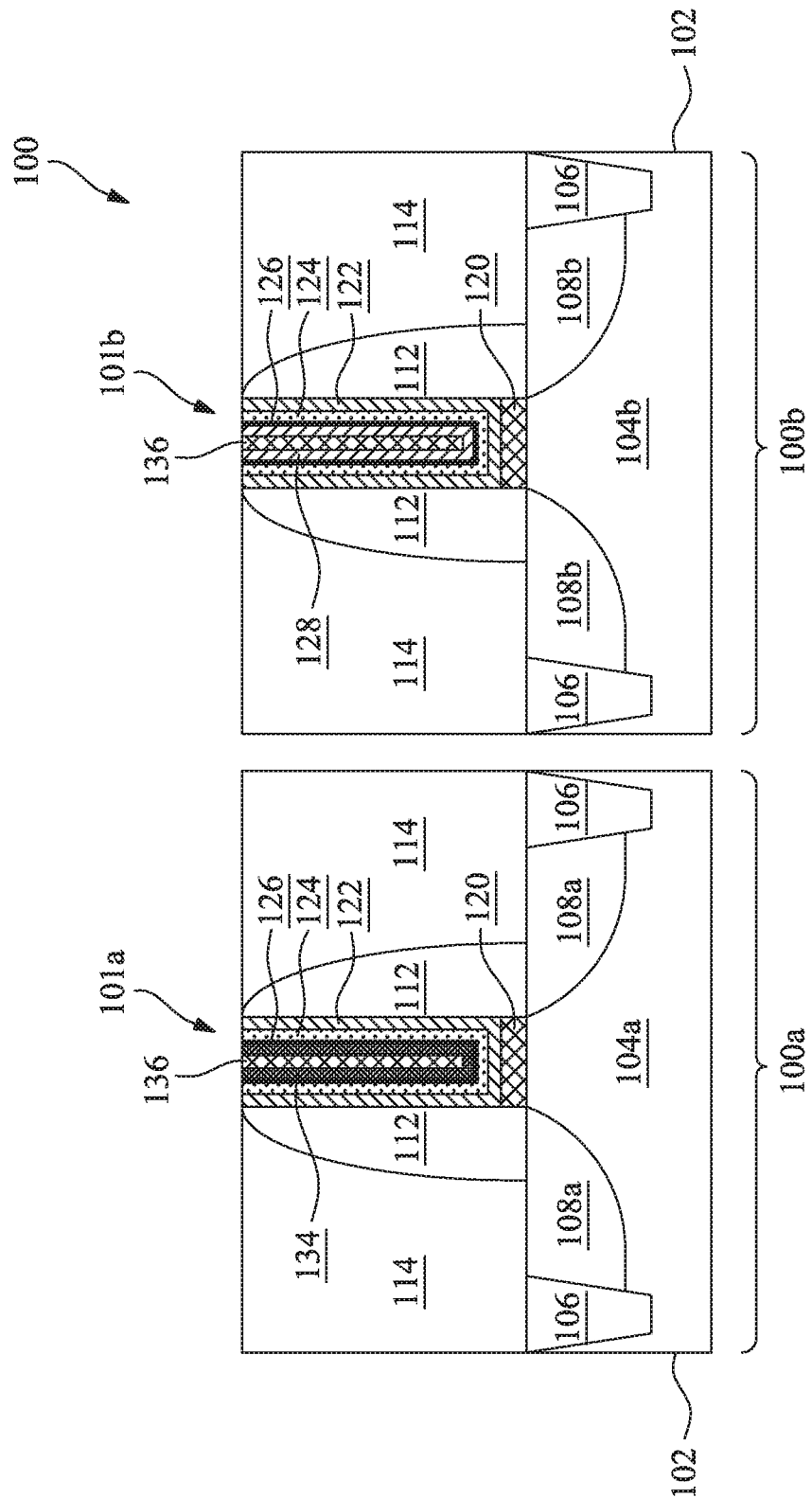

At operation 26, the method 10 (FIG. 1) forms a work function metal layer 134 in the trench 116a. Referring to FIG. 12, in the present embodiment, the work function metal layer 134 includes an n-type work function material that is suitable for forming an nFET in the device region 100a. For example, it may be formed of an aluminum-containing material. In one example, the work function metal layer 134 has a thickness of about 10 to about 50 Å. As shown in FIG. 12, the work function metal layer 134 is formed in the trench 116a and not in the trench 116b. This can be achieved by a metal patterning process similar to what has been discussed above in association with operations 22 and 24. For example, the work function metal layer 134 may be first deposited in both trenches 116a and 116b similar to operation 22, and then it is removed from the trench 116b similar to operation 24, thereby leaving the work function metal layer 134 in the trench 116a. In various embodiments, the work function metal layer 134 may be formed before or after the work function metal layer 128. After operation 26, the gate structures 101a and 101b each have been formed with the interfacial layer 120, the gate dielectric layer 122, the barrier layer 124, the oxide layer 126, and the respective work function metal layers 134 and 128, as shown in FIG. 14 which is a schematic cross sectional view of the device 100 along a fin width direction of the respective fins 104a/b.

At operation 28, the method 10 (FIG. 1) performs further operations in order to form a final device. For example, the method 10 may form a fill layer 136 (FIG. 13) in the remaining spaces of the trenches 116a/b. The fill layer 136 may include aluminum (Al), tungsten (W), cobalt (Co), copper (Cu), and/or other suitable materials. The fill layer 136 may be formed by CVD, PVD, plating, and/or other suitable processes. A CMP process may be performed to remove excess materials from the gate structures 101a/b so as to planarize a top surface of the device 100. Yet further operations may follow. For example, operation 28 may form contacts and vias electrically connecting the source/drain features 108a/b and the gate structures 101a/b and form metal interconnects connecting the FinFETs to other portions of the device 100 to form a complete IC.

Although not intended to be limiting, one or more embodiments of the present disclosure provide many benefits to a semiconductor device and the formation thereof. For example, embodiments of the present disclosure provide methods for patterning work function metal layer(s) in a "gate-last" process. According to the present disclosure, a barrier layer is formed over a gate dielectric layer and an oxide layer is formed over the barrier layer. The oxide layer stops various etchants used in the metal patterning process from reaching the barrier layer. As a result, the barrier layer retains its blocking capability so as to protect the gate dielectric layer from contamination by work function metal layer(s). Various embodiments of the present disclosure can be easily integrated into existing FinFET fabrication flow for 16 nm and smaller process nodes. For example, in various embodiments, the oxide layer may be formed by an oxygen treatment process performed in an existing etching or ashing tool, or by deposition methods. For example, the metal patterning process may use an etchant containing phosphoric acid and may be performed in any existing wet etching tool.

In one exemplary aspect, the present disclosure is directed to a method of forming a semiconductor device. The method includes receiving a substrate, a dummy gate stack formed over the substrate, and a structure surrounding the dummy gate stack. The method further includes removing the dummy gate stack, resulting in a trench in the structure. The method further includes forming a gate dielectric layer in the trench, forming a barrier layer over the gate dielectric layer, forming an oxide layer over the barrier layer, and forming a first work function metal layer over the oxide layer. In embodiments, the method further includes removing the first work function metal layer by an etchant containing phosphoric acid and forming a second work function metal layer over the oxide layer, wherein the second work function metal layer is different from the first work function metal layer.

In another exemplary aspect, the present disclosure is directed to a method of forming a semiconductor device. The method includes receiving a substrate and first and second gate structures over the substrate, wherein the first and second gate structures include first and second trenches. The method further includes forming a gate dielectric layer in the first and second trenches; forming a barrier layer over the gate dielectric layer; and forming an oxide layer over the barrier layer, wherein the oxide layer includes one of: tantalum oxide, titanium oxide, and niobium oxide. The method further includes forming a first work function metal layer over the oxide layer.

In another exemplary aspect, the present disclosure is directed to a semiconductor device. The semiconductor device includes a substrate and first and second gate structures over the substrate. The first and second gate structures each include a gate dielectric layer over the substrate, a barrier layer over the gate dielectric layer, and an oxide layer over the barrier layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate; and
a gate structure over the substrate, wherein the gate structure includes:
   a gate dielectric layer over the substrate,
   a barrier layer over the gate dielectric layer,
   an oxide layer over the barrier layer, and
   a work function metal layer over the oxide layer.

2. The semiconductor device of claim 1, wherein the barrier layer and the oxide layer contain a common metal element.

3. The semiconductor device of claim 2, wherein the common metal element is one of: tantalum, titanium, and niobium.

4. The semiconductor device of claim 2, wherein the barrier layer comprises a nitride of the common metal element and the oxide layer comprises an oxide of the common metal element.

5. The semiconductor device of claim 1, wherein the barrier layer includes tantalum nitride and the oxide layer includes tantalum oxide.

6. The semiconductor device of claim 1, wherein the barrier layer includes titanium nitride and the oxide layer includes titanium oxide.

7. The semiconductor device of claim 1, wherein the barrier layer includes niobium nitride and the oxide layer includes niobium oxide.

8. The semiconductor device of claim 1, wherein the gate structure further includes an interfacial layer under the gate dielectric layer.

9. The semiconductor device of claim 1, wherein the gate structure further includes a fill layer over the work function metal layer, and the fill layer comprises aluminum (Al), tungsten (W), cobalt (Co), or copper (Cu).

10. The semiconductor device of claim 1, wherein the work function metal layer comprises a titanium-containing material and the oxide layer includes tantalum oxide.

11. A semiconductor device, comprising:
a substrate; and
a gate structure over the substrate, wherein the gate structure includes:
a gate dielectric layer over the substrate,
a barrier layer over the gate dielectric layer,
an oxide layer over the barrier layer, and
a work function metal layer over the oxide layer, wherein the barrier layer and the oxide layer contain a common metal element.

12. The semiconductor device of claim 11, wherein the barrier layer comprises a nitride of the common metal element and the oxide layer comprises an oxide of the common metal element.

13. The semiconductor device of claim 12, wherein the common metal element is one of tantalum, titanium, and niobium.

14. The semiconductor device of claim 13, wherein the barrier layer has a thickness ranging from 5 to 20 angstrom (Å), and the oxide layer has a thickness ranging from 5 to 20 Å.

15. The semiconductor device of claim 11, wherein the oxide layer and the work function metal layer comprises different metal elements.

16. A semiconductor device, comprising:
a substrate; and
first and second gate structures over the substrate, wherein the first and second gate structures each include:
a gate dielectric layer over the substrate,
a barrier layer over the gate dielectric layer, and
an oxide layer over the barrier layer.

17. The semiconductor device of claim 16, wherein:
the first gate structure further includes an n-type work function metal layer over the oxide layer of the first gate structure; and
the second gate structure further includes a p-type work function metal layer over the oxide layer of the second gate structure.

18. The semiconductor device of claim 16, wherein the barrier layer includes tantalum nitride and the oxide layer includes tantalum oxide.

19. The semiconductor device of claim 16, wherein the barrier layer includes titanium nitride and the oxide layer includes titanium oxide.

20. The semiconductor device of claim 16, wherein the barrier layer includes niobium nitride and the oxide layer includes niobium oxide.

* * * * *